(12) United States Patent
An et al.

(10) Patent No.: US 12,453,025 B2
(45) Date of Patent: Oct. 21, 2025

(54) POSITION LOCK FOR RACK ASSEMBLY

(71) Applicant: ZT GROUP INT'L, INC., Secaucus, NJ (US)

(72) Inventors: Chen An, Bergenfield, NJ (US); Yuan Zhang, North Bergen, NJ (US)

(73) Assignee: ZT GROUP INT'L, INC., Secaucus, NJ (US)

( * ) Notice: Subject to any disclaimer, the term of this patent is extended or adjusted under 35 U.S.C. 154(b) by 97 days.

(21) Appl. No.: 18/485,431

(22) Filed: Oct. 12, 2023

(65) Prior Publication Data

US 2025/0126728 A1    Apr. 17, 2025

(51) Int. Cl.
 H05K 5/02    (2006.01)
 H05K 7/14    (2006.01)

(52) U.S. Cl.
 CPC ......... *H05K 5/0221* (2013.01); *H05K 7/1489* (2013.01)

(58) Field of Classification Search
 CPC ... E05B 17/047; E05B 17/048; H05K 5/0217; H05K 5/0221; H05K 7/047; H05K 7/048
 USPC ............................................................ 292/34
 See application file for complete search history.

(56) References Cited

U.S. PATENT DOCUMENTS

| | | | |
|---|---|---|---|
| 5,816,672 A * | 10/1998 | LaPointe | G11B 33/127 312/219 |
| 11,678,458 B1 * | 6/2023 | Krietzman | H05K 7/1489 29/428 |
| 2015/0366092 A1 * | 12/2015 | Grandidge | F16L 3/01 248/68.1 |
| 2018/0177066 A1 * | 6/2018 | White | H05K 7/1489 |
| 2018/0177069 A1 * | 6/2018 | Dennison | H05K 7/1489 |
| 2019/0062053 A1 * | 2/2019 | Jensen | H05K 7/18 |
| 2019/0246514 A1 * | 8/2019 | Hill | G11B 33/0433 |
| 2021/0153376 A1 * | 5/2021 | Delon Canseco | F16F 1/3732 |

* cited by examiner

*Primary Examiner* — Nathan Cumar
(74) *Attorney, Agent, or Firm* — SCULLY, SCOTT, MURPHY & PRESSER, P.C.

(57) ABSTRACT

A position lock is provided for a rack assembly. The position lock includes a cam operable to rotate in a push direction. When the cam is rotated in the push direction, the cam is operable to push against an inner rail of the rack assembly to linearly translate the inner rail along the rack assembly in a frontward direction.

20 Claims, 10 Drawing Sheets

POSITION LOCK FOR RACK ASSEMBLY

FIELD

The present disclosure relates generally to a position lock operable to adjust a position of an inner rail of a rack assembly.

BACKGROUND

Rack assemblies include inner rails that, in certain situations, need to be pushed and locked in position, for example against a front post. The movement of the inner rail is precisely controlled so that the inner rail is in the desired position in the rack assembly. Once in place, the inner rail needs to be locked in position to prevent further movement.

BRIEF DESCRIPTION OF THE DRAWINGS

Implementations of the present technology will now be described, by way of example only, with reference to the attached figures, wherein.

DETAILED DESCRIPTION

Figure 1:
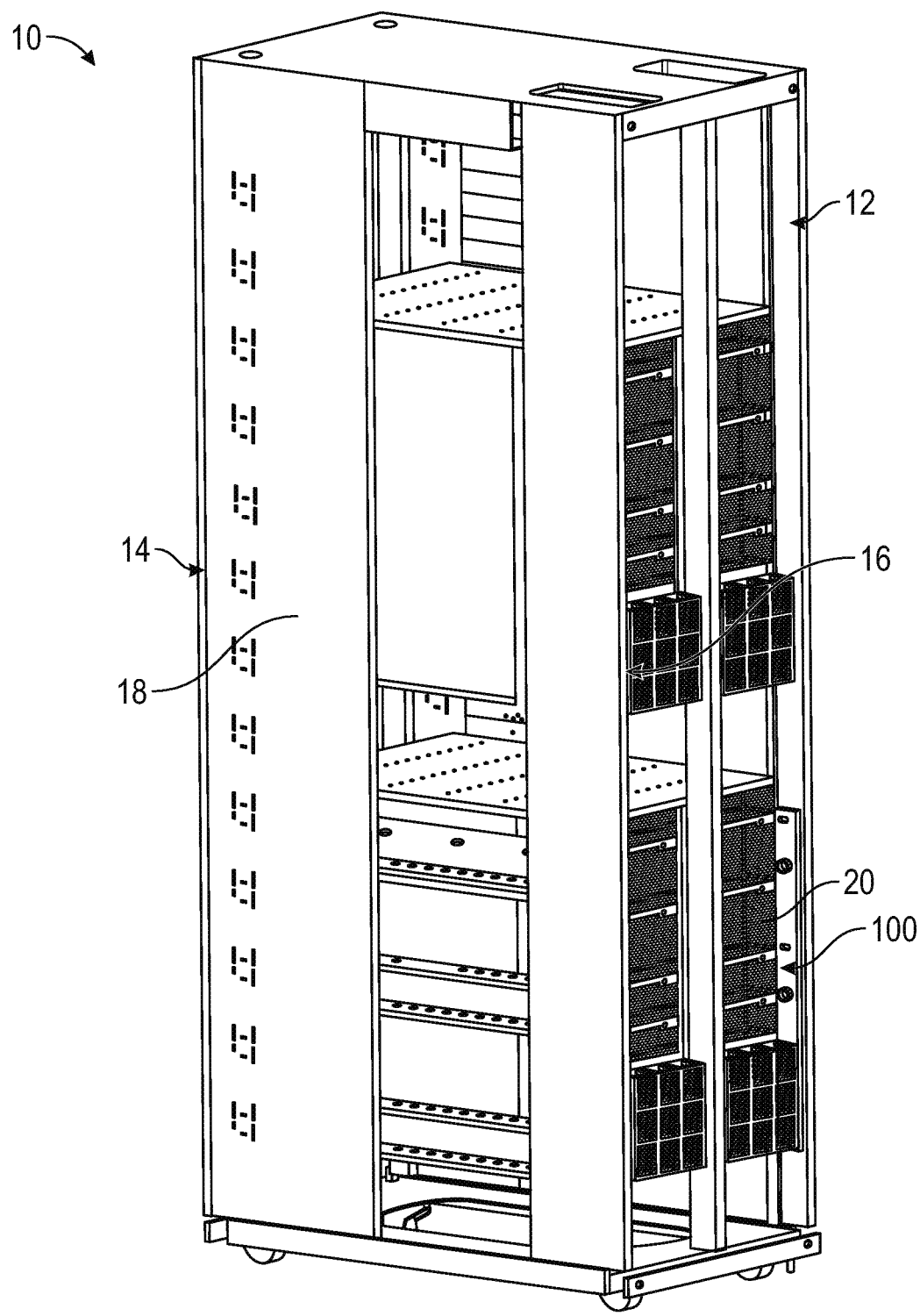
FIG. 1 illustrates a rack assembly with a plurality of computing units disposed on an inner rail that include a position lock.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

Several definitions that apply throughout this disclosure will now be presented. The term "coupled" is defined as connected, whether directly or indirectly through intervening components, and is not necessarily limited to physical connections. The term "substantially" is defined to be essentially conforming to the particular dimension, shape or other word that substantially modifies, such that the component need not be exact. For example, substantially cylindrical means that the object resembles a cylinder, but can have one or more deviations from a true cylinder. The term "about" means reasonably close to the particular value. For example, about does not require the exact measurement specified and can be reasonably close. As used herein, the word "about" can include the exact number. The term "near" as used herein is within a short distance from the particular mentioned object. The term "near" can include abutting as well as relatively small distance beyond abutting. The terms "comprising," "including" and "having" are used interchangeably in this disclosure. The terms "comprising," "including" and "having" mean to include, but not necessarily be limited to the things so described.

The conventional tolerances only specify the distance between a front post and a busbar of a rack, resulting in undefined tolerances for any system mounted to the rack without a position lock as disclosed herein on the front. This issue particularly affects larger systems like integrated storage systems or AI server which can lack sufficient horizontal space for a front position lock.

The rack assemblies may encounter impacts during transportation processes, and conventional mechanisms, such as utilization of a bolt, to control the positioning of the inner rail are not strong enough to withstand the impacts possible during transportation.

The position lock disclosed herein involves a rear stopping mechanism, employing a cam under a standardized torque, to guide the computing system towards a front post via a set of inner rails.

FIG. 1 illustrates a rack assembly 10 that includes a rack 12 that is operable to receive one or more computing systems 20. The rack 10 can include a front post 14, a rear post 16 opposite the front post 14, and a side 18 that can span between the front post 14 and the rear post 16. The computing system 20 can be slidably received in the rack 12.

A position lock 100 can be coupled to the rack 12. The position lock 100 can be operable to provide a rear stopping mechanism to guide the computing system 20 towards the front post 14. Accordingly, the position lock 100 can ensure the correct positioning of the computing system 20 in the rack 12. Additionally, the position lock 100 can secure the computing system 20 in the rack 12 to prevent undesired movement which can reduce or prevent damage to the rack assembly 10.

In at least one example, the position lock 100 can be coupled with the rear post 16. In some examples, the position lock 100 can be coupled with the side 18 proximate the rear post 16.

Figure 2A:
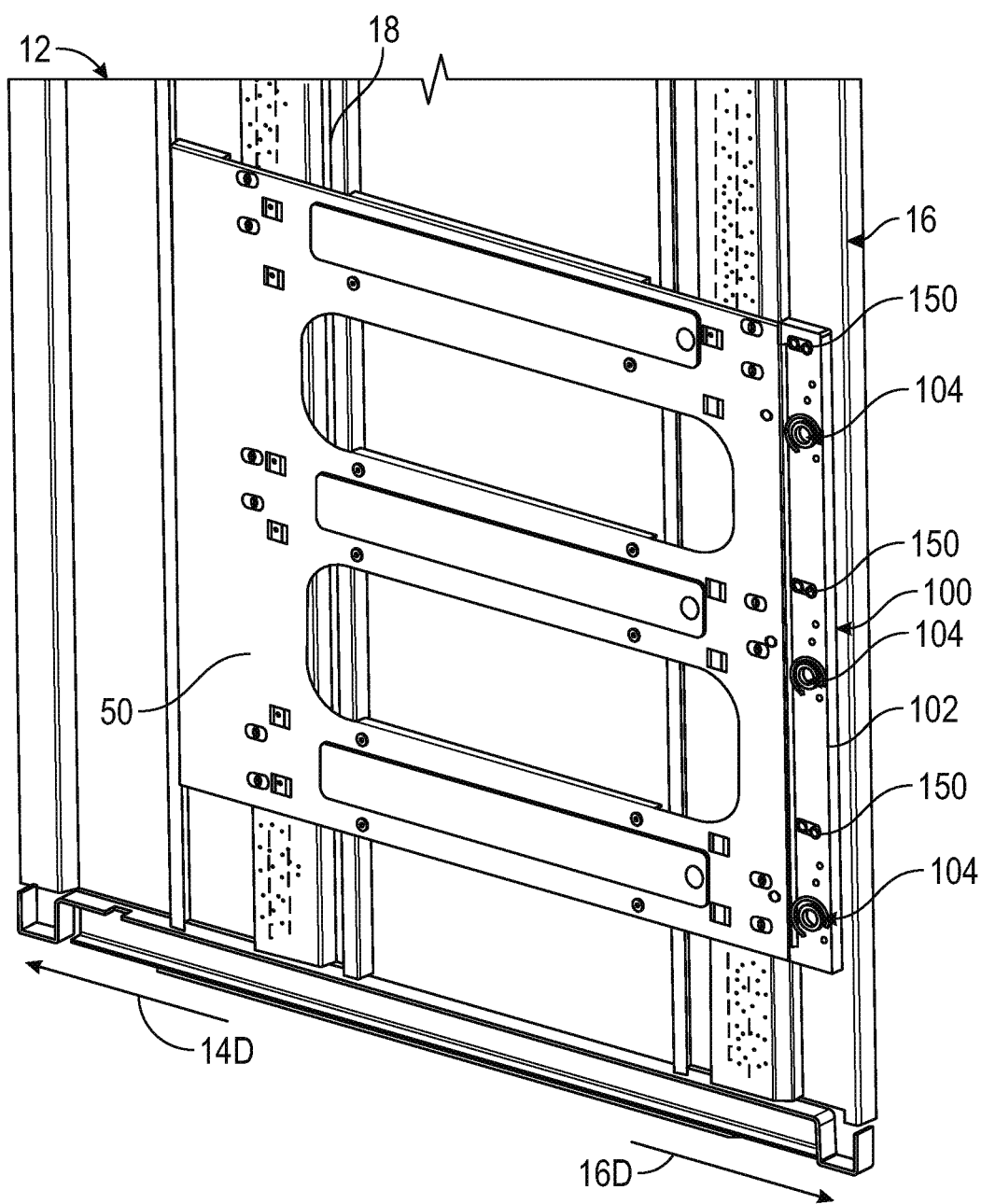
FIG. 2A illustrates an inner rail with the position lock.
Figure 2B:
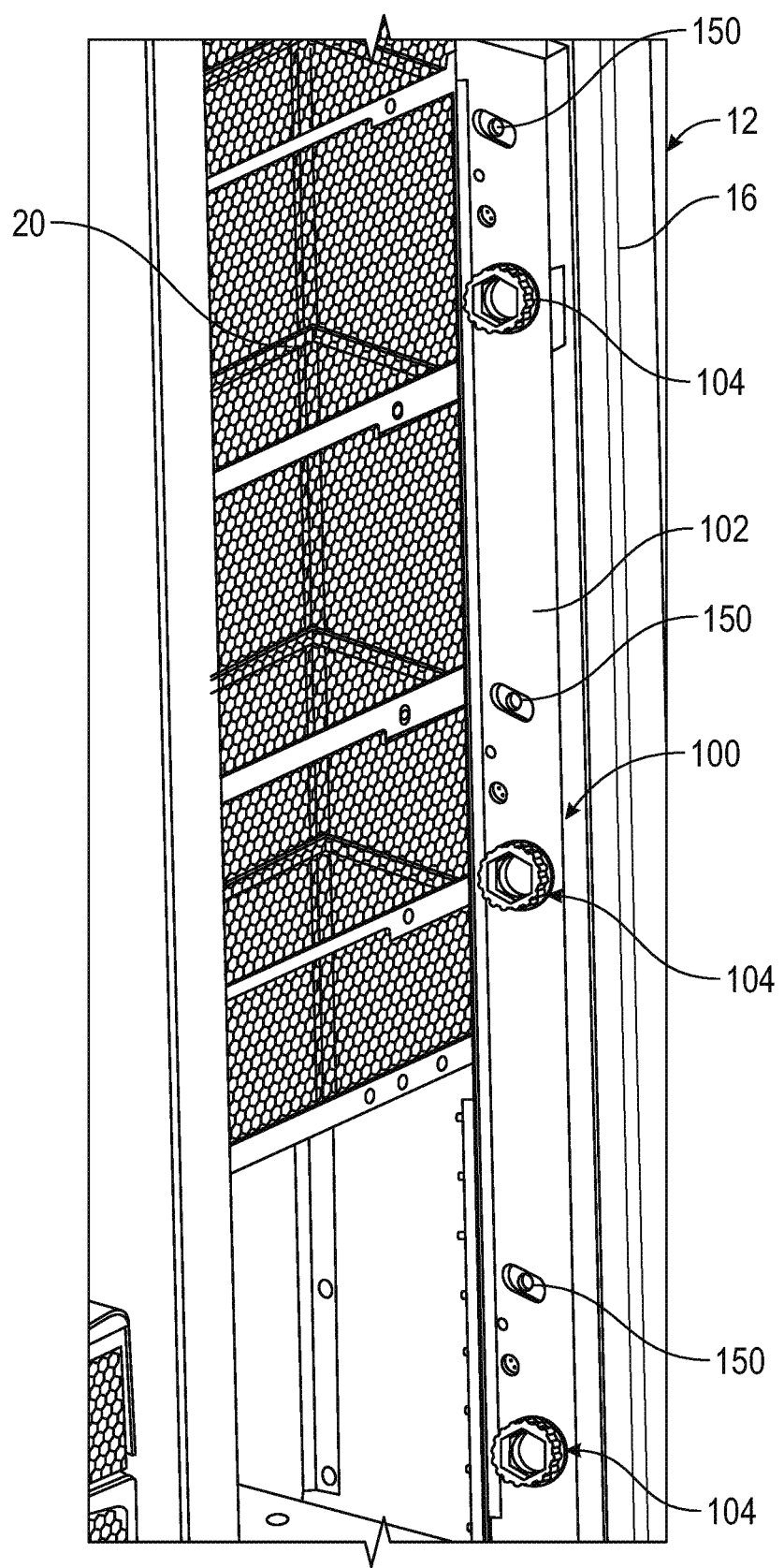
FIG. 2B illustrates the position lock.

Referring to FIG. 2A, the rack assembly 10 can include an inner rail 50 slidably coupled with the rack 12. The inner rail 50 can be coupled with the side 18. In some examples, the inner rail 50 can be coupled with the front post 14 and/or the rear post 16. FIG. 2A illustrates one inner rail 50 coupled to one side 18 of the rack 12. The rack assembly 10 can include more than one inner rail 50 coupled to each side 18 of the rack 12 without deviating from the scope of the disclosure. For example, the rack assembly 10 can include a plurality of inner rails 50 to each correspond with a computing system 20. In some examples, the rack assembly 10 can include corresponding pairs of inner rails 50 on both sides 18 of the rack 12.

The inner rails 50 can be operable to slide in relation to the rack 12. For example, the inner rails 50 can be operable to slide along a longitudinal axis between the front post 14 and the rear post 16.

The inner rails 50 can be operable to receive the computing system 20. In some examples, the computing system 20 can be slidably received by the inner rails 50. In some examples, the computing system 20 can be fixedly coupled with the inner rails 50. Accordingly, when the inner rails 50 slide in the rack 12, the computing system 20 translates along with the inner rails 50. Similarly, when the computing system 20 is moved to translate along the longitudinal axis between the front post 14 and the rear post 16 (e.g., towards the front post 14), the inner rails 50 are operable to slide in relation to the rack 12 to move the computing system 20.

As illustrated in FIGS. 2A-2D, the position lock 100 can be operable to translate the inner rail 50 along the rack 12 along the longitudinal axis between the front post 14 and the rear post 16. For example, the position lock 100 can be operable to guide the computing system 20 towards the front post 16 via the inner rails 50. The position lock 100 is operable to provide sufficient strength to withstand impact (e.g., during transportation) while being easily operated to adjust the position of the inner rail 50 and the computing system 20.

The position lock 100 can be positioned to abut against the inner rail 50. In some examples, the position lock 100 can be positioned proximate to the inner rail 50 such that the position lock 100 in operation can abut against and push the inner rail 50 and/or the computing system 20 along the longitudinal axis towards the front post 14.

In at least one example, the position lock 100 can include a support 102 operable to be coupled with the rack 12. The support 102 can house the components of the position lock 100 as well as provide a secure base such that when the position lock 100 is pushing against the inner rail 50 and/or the computing system 20, the position lock 100 does not move in relation to the rack 12 and handles the counterforce.

Figure 2C:
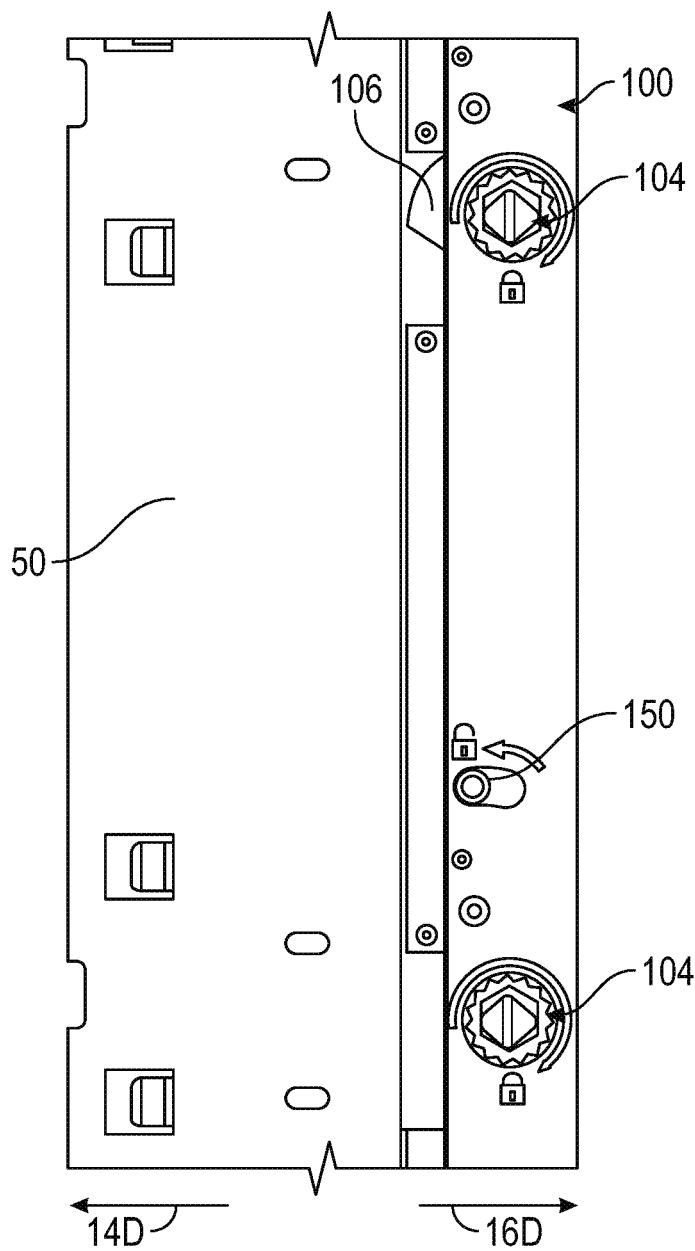
FIG. 2C illustrates the position lock.
Figure 2D:
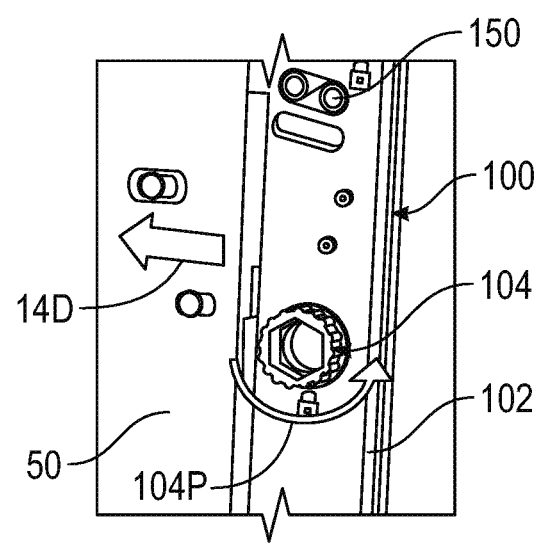
FIG. 2D illustrates the position lock in operation to adjust the position of the inner rail.

The position lock 100 can include a cam 104. In at least one example, the cam 104 can be received in the support 102. In at least one example, the cam 104 can extend through the support 104 so that the cam 104 can be accessed from the support 104. The cam 104 can be rotated, as shown in FIG. 2D, in a push direction 104P about a cam rotation axis (not shown). When the cam 104 is rotated in the push direction 104P about the cam rotation axis, the cam 104 can be operable to push against the inner rail 50 of the rack assembly 10 to linearly translate the inner rail 50 along the rack assembly 10 in a frontward direction 14D (e.g., towards the front rail 14).

The cam 104 can be operable to transform rotary motion of the cam 104 into linear motion for the inner rail 50 and/or the computing system 20. The cam 104 can have a curved surface 106 (as shown in FIG. 2C) that includes a compound curve so that when the cam 104 is rotated in the push direction 104P about the cam rotation axis, the curved surface 106 abuts against the inner rail 50. As the cam 104 is further rotated in the push direction 104P about the cam rotation axis, the curved surface 106 slides against the inner rail 50. With the compound curved of the curved surface 106, the rotary movement of the cam 104 translates into linear movement of the inner rail 50. The inner rail 50 and the computing system 20 can then be pushed linearly in the frontward direction 14D towards the front rail 14 until the desired position is achieved.

In at least one example, the cam 104 can be operable to translate the inner rail 50 a linear distance between 5 millimeters and 15 millimeters. In some examples, the cam 104 can be operable to translate the inner rail 50 the linear distance between about 8 millimeters and about 12 millimeters. In some examples, the cam 104 can be operable to translate the inner rail 50 a linear distance about 10 millimeters.

If the cam 104 is not rotated, and the curved surface 106 is abutting against the inner rail 50, the inner rail 50 is prevented from moving in the rearward direction 16D unless the locking mechanism 120 is transitioned from a locked configuration to an unlocked configuration via the unlock portion 150. Accordingly, the position of the inner rail 50 and the computing system 20 is secured and undesired movement is reduced or prevented. Damage to the rack system 10 can then be reduced or prevented.

Figure 3A:
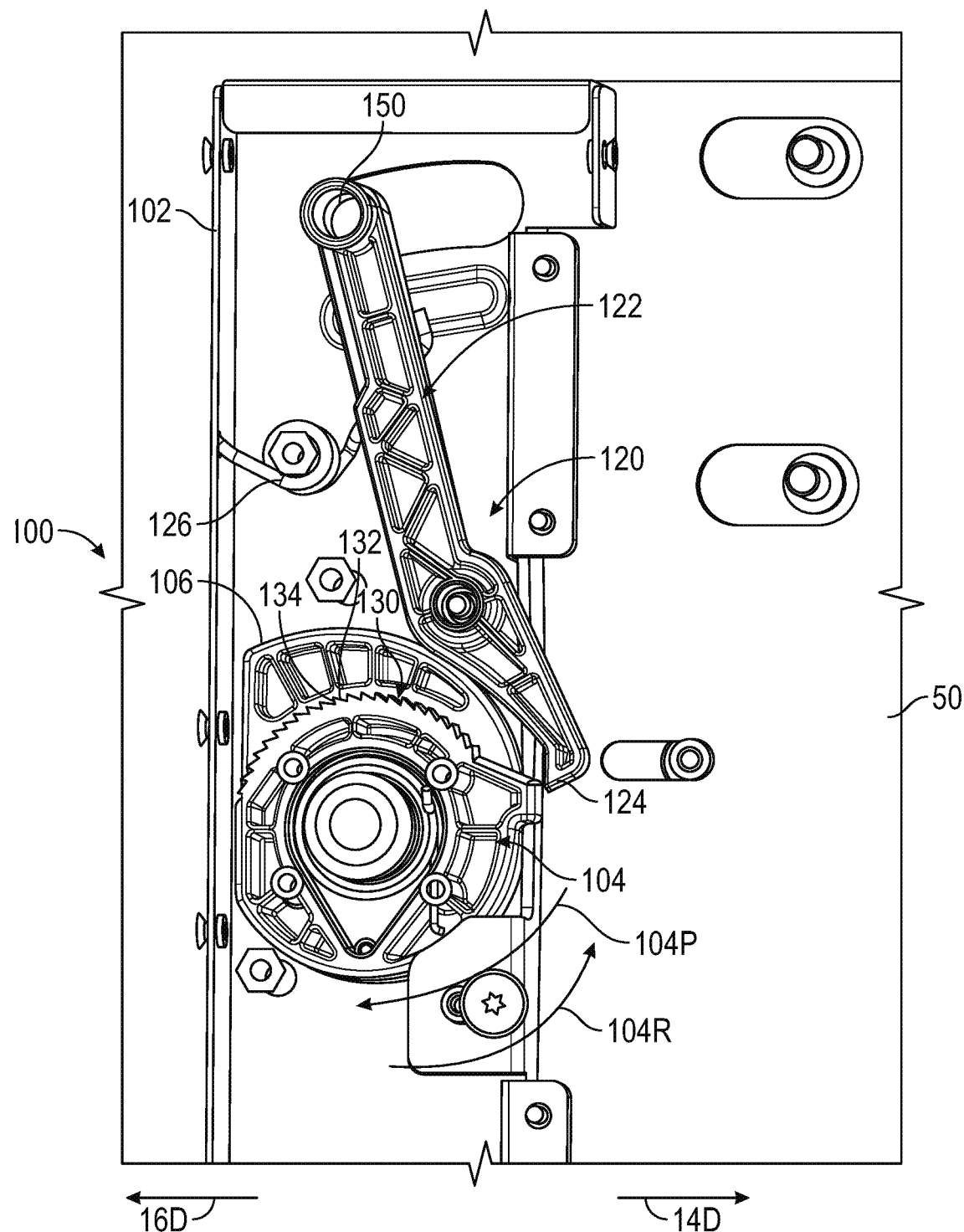
FIG. 3A illustrates the position lock in a first position.
Figure 3B:
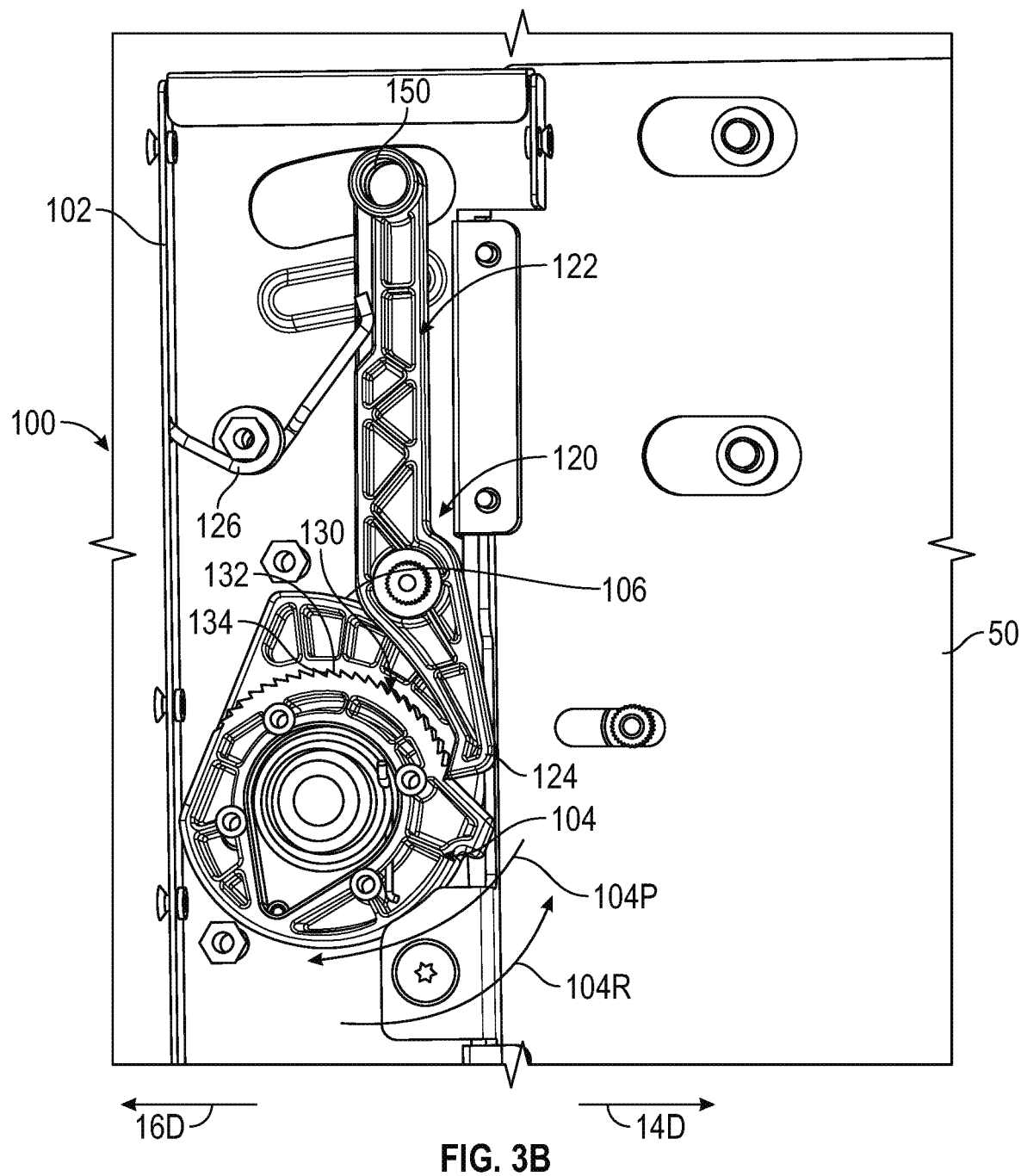
FIG. 3B illustrates the position lock in a second position.
Figure 3C:
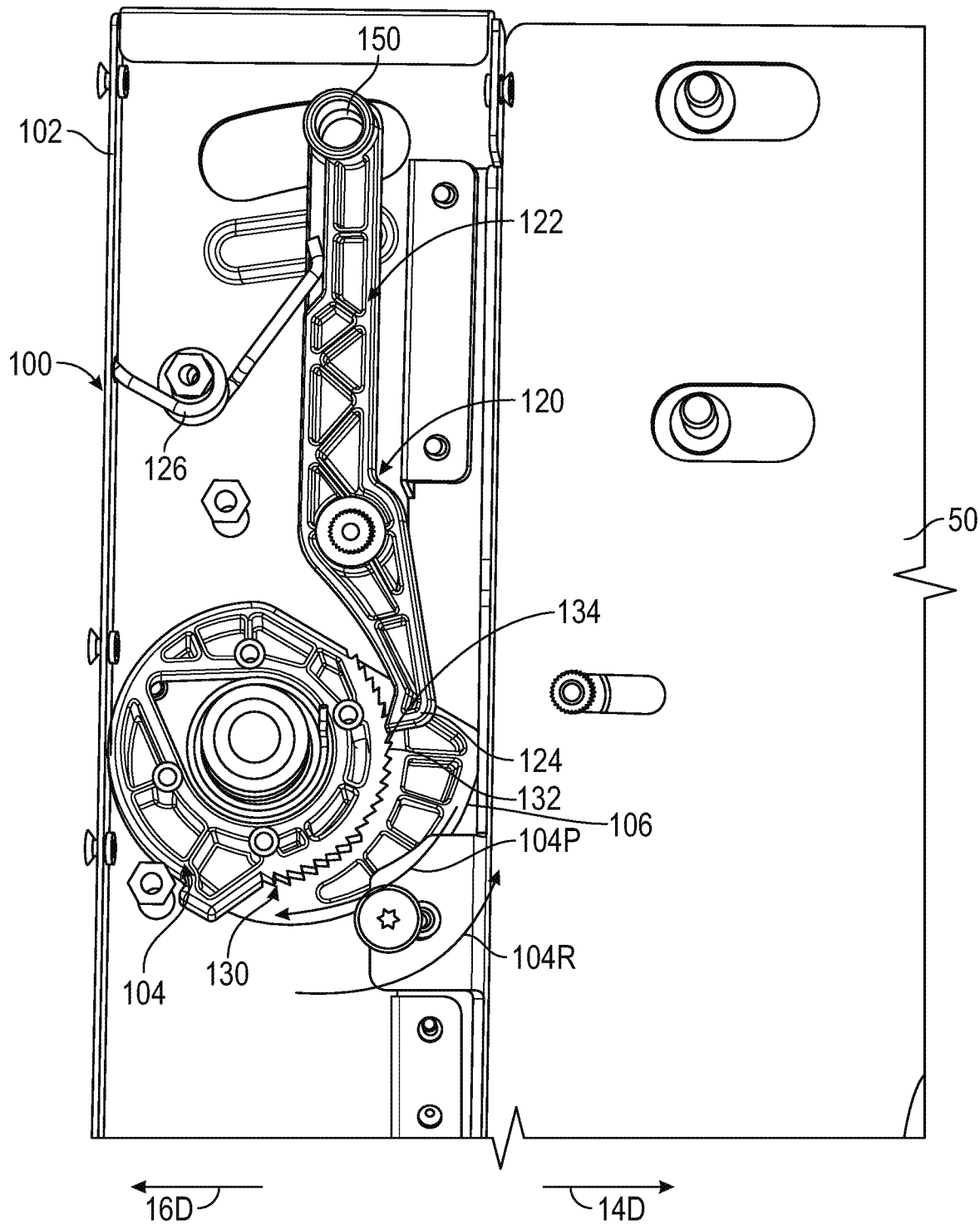
FIG. 3C illustrates the position lock in a third position.

FIGS. 3A-3C illustrate the locking mechanism 120 of the position lock 100 interacting with the cam 104 as the cam 104 rotates in the push direction 104P to push against the inner rail 50 linearly in the frontward direction 14D. FIG. 3A illustrates the cam 104 of the position lock 100 in a first position where the curved surface 106 of the cam 104 is not yet engaged with the inner rail 50. FIG. 3B illustrates the cam 104 rotating in the push direction 104P so that the curved surface 106 is abutting against the inner rail 50. FIG. 3C illustrates the cam 104 further rotating in the push direction 104P so that the rotation of the cam 104 and the curved surface 106 translates the inner rail 50 in the frontward direction 14D.

As shown in FIGS. 3A-3C, as the cam 104 rotates, the locking mechanism 120 adjusts its interaction with the cam 104. The locking mechanism 120 in the locked configuration, as shown in FIGS. 3A-3C, is operable to maintain a rotational position of the cam 104 to prevent the cam 104 from rotating in a reverse direction 104R that is opposite the push direction 104P. Accordingly, when the locking mechanism 120 is in the locked configuration, the cam 104 can only rotate in the push direction 104P. This prevents the cam 104 from rotating in the reverse direction 104R and also prevents the inner rail 50 and the computing system 20 from moving in the rearward direction 16D towards the rear post 16. This helps maintain the position of the inner rail 50 and the computing system 20 in a secured manner. Additionally, the locking mechanism 120 in the locked configuration allows the rack assembly 10 to fix the inner rail 50 and the computing system 20 at any position within the desired range (e.g., between 5 millimeters and 15 millimeters).

In at least one example, as illustrated in FIGS. 3A-3C, the locking mechanism 120 can include a ratchet mechanism. For example, the locking mechanism 120 can include a lock handle 122. The lock handle 122 can form a pawl 124, and the cam 104 can form a plurality of teeth 130. The pawl 124 can include a curved portion which is operable to engage with the teeth 130 of the cam 104 so that the cam 104 can only rotate in the push direction 104P unless the locking mechanism is transitioned to an unlocked configuration (for example as shown in FIG. 4).

The teeth 130 of the cam 104 can form a slope end 132 and a steep end 134. The slope end 132 can have a lower angle than the steep end 134. As the cam 104 rotates in the push direction 104P, the pawl 124 can slide against the slope end 132. The locking mechanism 120 can include a spring 126 operable to enact a spring force against the lock handle 122 such that the pawl 124 is pushed against the plurality of teeth 130. Accordingly, when the pawl 124 slides against the slope end 132 and reaches the steep end 134, the spring 126 pushes the pawl 124 into the depression between the teeth 130, and the pawl 124 abuts against the steep end 134. The force of the pawl 124 against the steep end 134 prevents the cam 104 from rotating in the reverse direction 104R.

Figure 4:
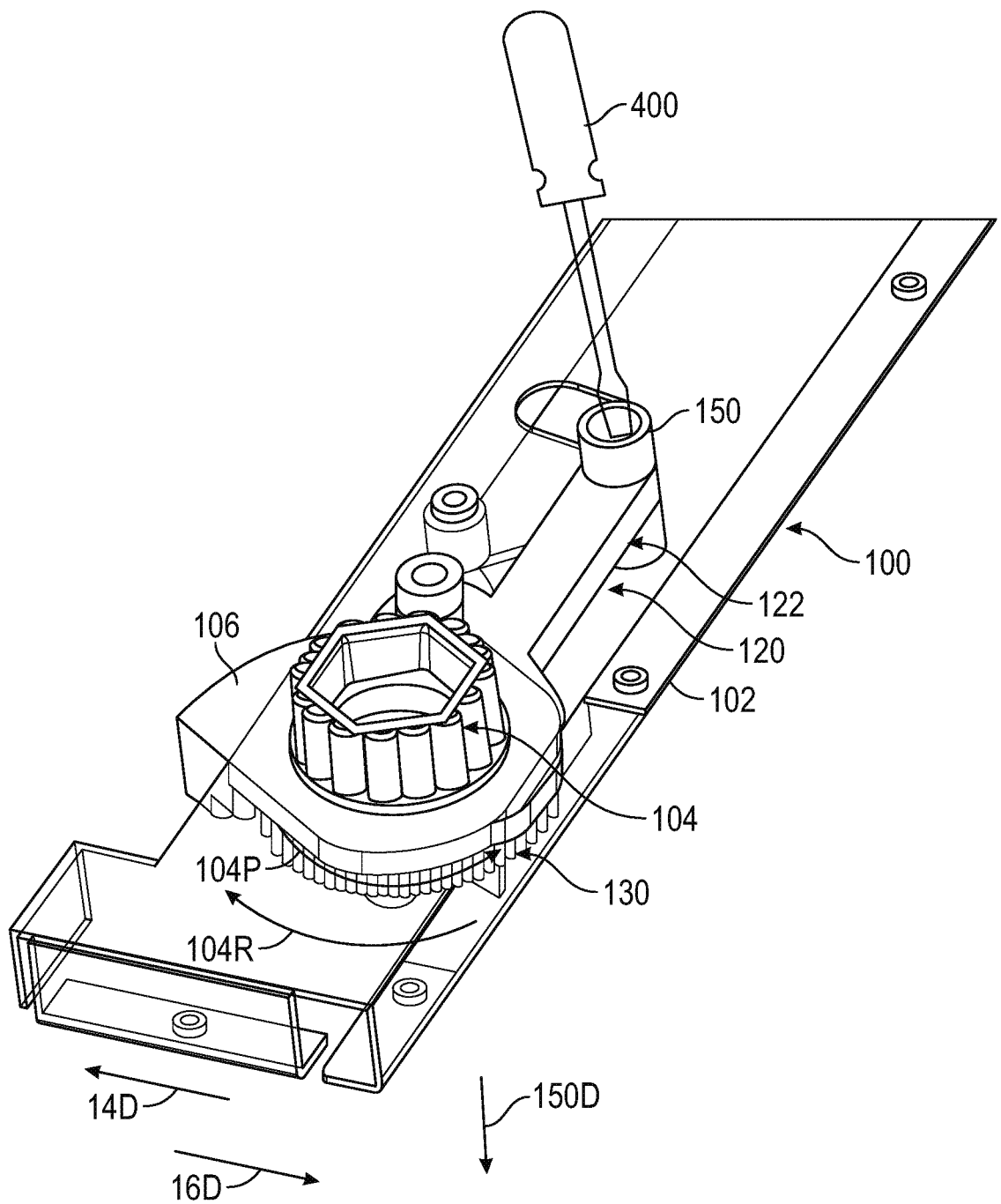
FIG. 4 illustrates transitioning the position lock to an unlocked configuration.

FIG. 4 illustrates the position lock 100 transitioning the locking mechanism 120 from the locked configuration to the unlocked configuration. In the unlocked configuration, the locking mechanism 120 is operable to allow the cam 104 to rotate in the reverse direction 104R opposite the push direction 104P. The cam 104 being allowed to rotate in the reverse direction 104R permits the inner rail 50 to linearly translate in the rearward direction 16D opposite the frontward direction 14D.

The lock handle 122 transitions from the locked configuration to the unlocked configuration by receiving an unlock force against an unlock portion 150 of the lock handle 122. In at least one example, as illustrated in FIG. 4, the unlock portion 150 can be exposed through the support 102 of the position lock 100. The unlock portion 150 can be positioned at an end of the lock handle 122 opposite the pawl 124. In other examples, the unlock portion 150 can be positioned at other positions along the lock handle 122. In some examples, the unlock portion 150 can include another component that interacts with the lock handle 122 and transfers the unlock force to the lock handle 122.

In at least one example, as illustrated in FIG. 4, the unlock force can be enacted on the unlock portion 150 via a tool 400. The tool 400 can include a screwdriver, a rod, or any other suitable tool 400 to push against the unlock portion 150. The unlock force can be in an unlock direction 150 transverse to the longitudinal axis. When the unlock portion 150 of the lock handle 122 receives the unlock force, the pawl 124 does not catch against the plurality of teeth 130 so that the cam 104 is rotatable in the reverse direction 104R. Accordingly, the inner rail 50 and the computing system 20 can translate in the rearward direction 16D towards the rear post 16. In some examples, the inner rail 50 can then be removed from the rack 12.

Figure 5:
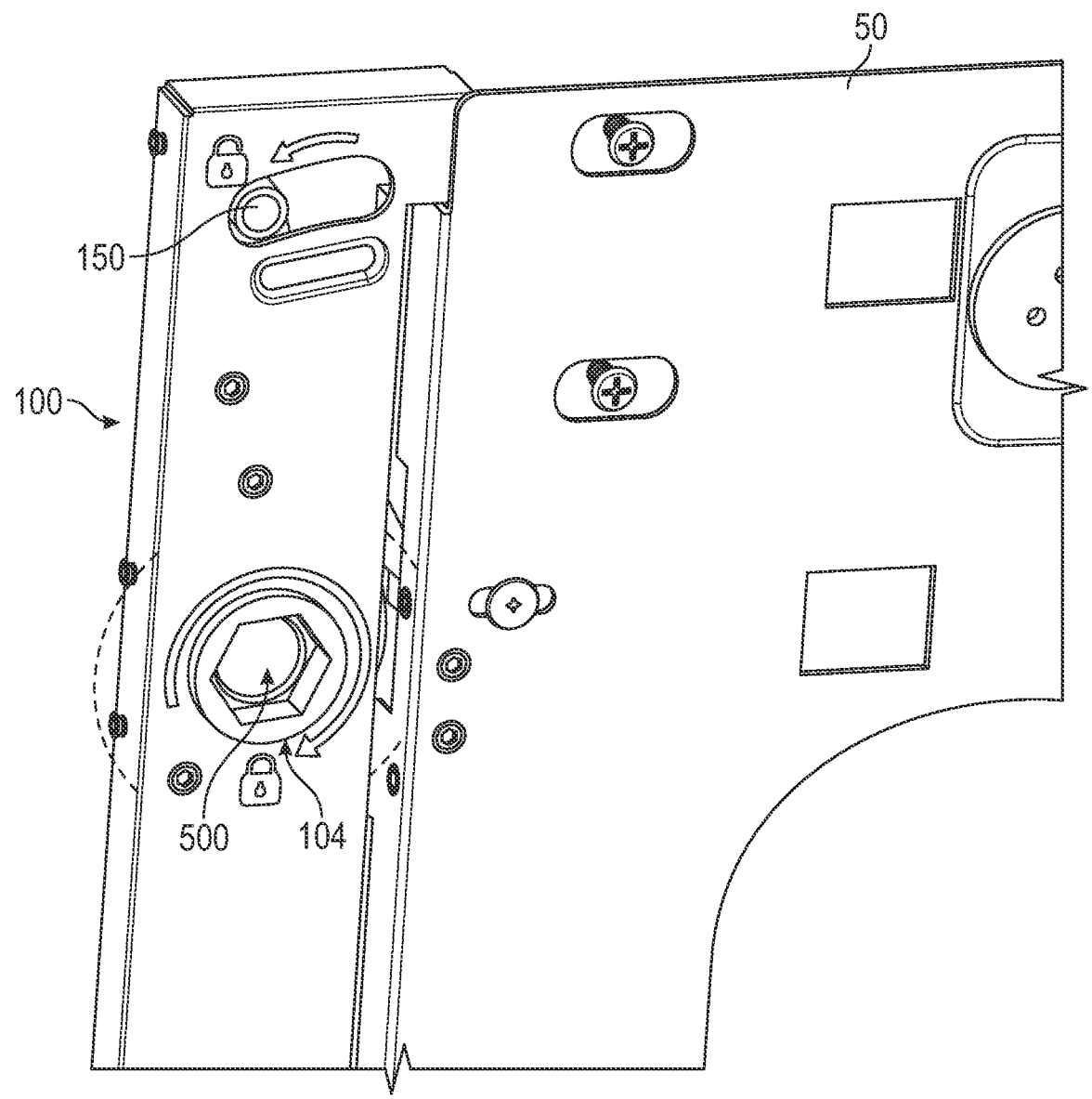
FIG. 5 illustrates an example of a position lock.

In at least one example, as illustrated in FIG. 5, the cam 104 can be operable to be rotated by a tool, for example a hex screwdriver. As shown in FIG. 5, the cam 104 can include a recess 500 that is recessed in from the support 102. The recess 500 can have one or more walls that are operable to receive the tool so that the tool can turn the cam 104. For example, as illustrated in FIG. 5, the recess 500 can have 6 walls to correspond with a hex screwdriver. In other examples, the recess 500 can have other configurations to correspond with different tools such as Philips screwdrivers, flathead screwdrivers, etc.

Figure 6:
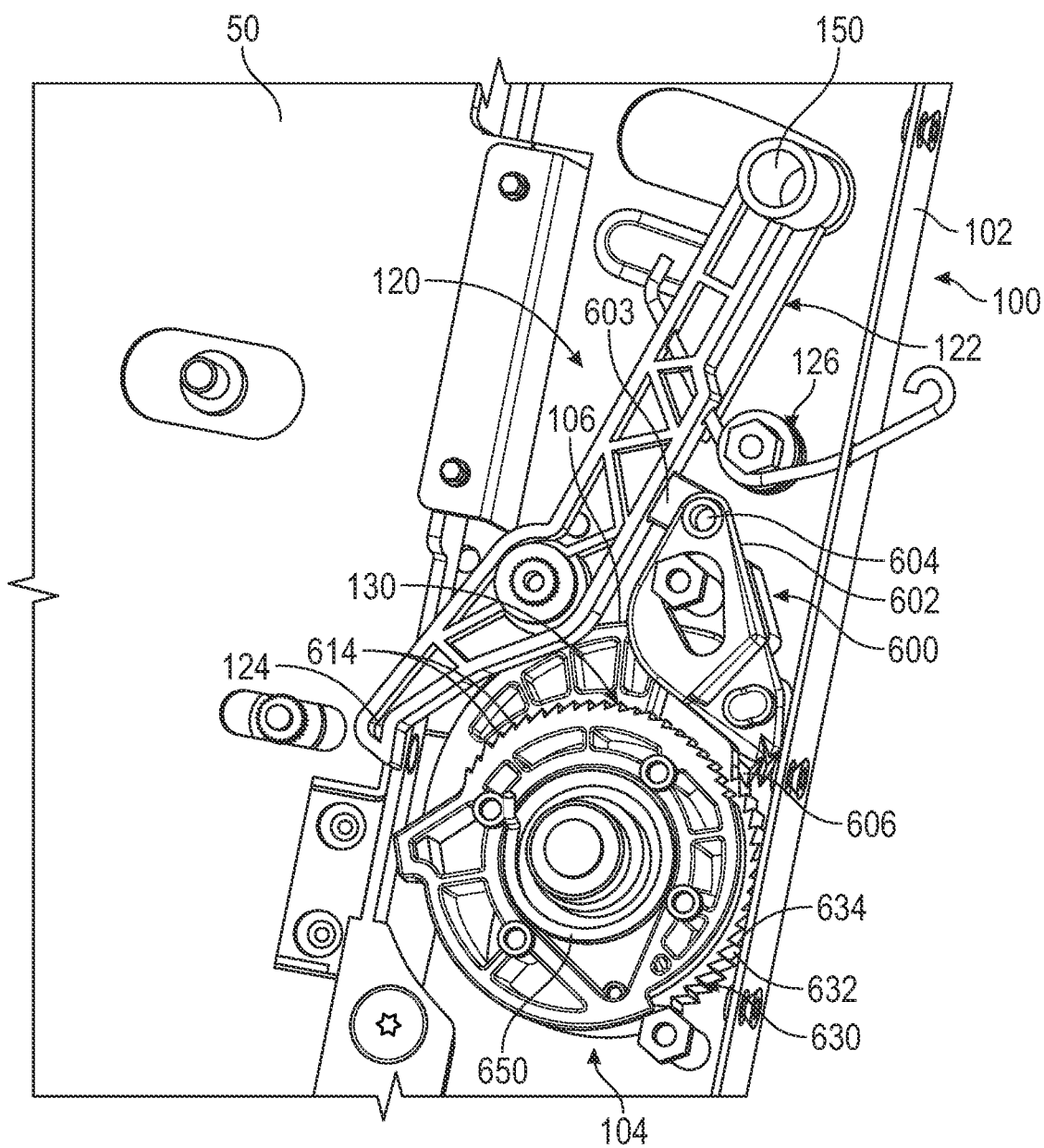
FIG. 6 illustrates a rear view of the position lock of FIG. 5.

In at least one example, as illustrated in FIG. 6, the position lock 100 can include a kick component 600. The kick component 600 can be operable to rotate the cam 104 in the reverse direction 104R so that the inner rail 50 slides back towards the support 102 and/or the rear post 16 in the rearward direction 16D.

In at least one example, as the lock handle 122 transitions to the unlocked configuration, the kick component 600 rotates the cam 104 in the reverse direction 104R. For example, the lock handle 122 can be coupled with the kick component 600 such that when the lock handle 122 is transitioned to the unlocked configuration and pivoted, the kick component 600 pivots and pushes the cam 104 in the reverse direction 104. As illustrated in FIG. 6, the kick component 600 can include a body 602 that is coupled to an extension 603 of the lock handle 122. The body 602 can include a kick pawl 606, and the cam 104 can form a second set of teeth 630. The kick pawl 606 can include a curved portion which is operable to engage with the teeth 630 of the cam 104 so that the cam 104 can only rotate in the reverse direction 104R while the locking mechanism 120 is transitioned to an unlocked configuration. When the locking mechanism 120 is in the unlocked configuration, the pawl 124 is not engaged with the teeth 130.

The teeth 630 of the cam 104 can be configured to be opposite of the teeth 130. Accordingly, the direction of the teeth 630 are opposite to the direction of the teeth 130. The teeth 630 can form a slope end 632 and a steep end 634. The slope end 632 can have a lower angle than the steep end 634. As the cam 104 rotates in the reverse direction 104R, the kick pawl 606 can slide against the slope end 632. When the kick pawl 606 slides against the slope end 632 and reaches the steep end 634, the kick pawl 606 is received into the depression between the teeth 630, and the kick pawl 606 abuts against the steep end 634. The force of the kick pawl 606 against the steep end 634 prevents the cam 104 from rotating in the push direction 104F.

When the lock arm 122 pivots into the unlocked configuration, the kick pawl 606 can be operable to push against the steep end 634 of the cam 104 so that the cam 104 rotates in the reverse direction 104R. As the cam 104 rotates in the reverse direction 104R, the kick pawl 606 can be operable to slide over the slope end 632 until being received in the subsequent steep end 634. The kick pawl 606 can continue pushing onto the subsequent steep end 634 to further push the cam 104 to rotate in the reverse direction 104R. Accordingly, as the lock mechanism 120 transitions to the unlocked configuration, the kick component 600 rotates the cam 104 in the reverse direction 104R to assist the inner rail 50 to translate in the rearward direction 16D.

In at least one example, a counter spring 650 can be coupled with the cam 104. The counter spring 650 can be operable to urge (e.g., enact a force) against the cam 104 towards rotating in the reverse direction 104R. The counter spring 650 can work with the kick component 600 to rotate the cam 104 in the reverse direction 104R when the lock mechanism 120 is in the unlocked configuration.

The embodiments shown and described above are only examples. Even though numerous characteristics and advantages of the present technology have been set forth in the foregoing description, together with details of the structure and function of the present disclosure, the disclosure is illustrative only, and changes may be made in the detail, especially in matters of shape, size and arrangement of the parts within the principles of the present disclosure to the full extent indicated by the broad general meaning of the terms used in the attached claims. It will therefore be appreciated that the embodiments described above may be modified within the scope of the appended claims.

What is claimed is:

1. A position lock for an inner rail of a rack assembly, the position lock comprising:
    a cam operable to rotate about a cam rotation axis in a push direction;
    wherein, when the cam is rotated in the push direction, the cam pushes against the inner rail of the rack assembly to linearly translate the inner rail relative to a rack of the rack assembly in a frontward direction that is perpendicular to the cam rotation axis.

2. The position lock of claim 1, wherein the cam includes a surface with a compound curve that pushes against the inner rail.

3. The position lock of claim 1, further comprising a locking mechanism, wherein the locking mechanism is operable to, while in a locked configuration, maintain a rotational position of the cam about the cam rotation axis to prevent the cam from rotating in a reverse direction about the cam rotation axis that is opposite the push direction.

4. The position lock of claim 3, wherein the locking mechanism is operable to, while in an unlocked configuration, allow the cam to rotate about the cam rotation axis in the reverse direction.

5. The position lock of claim 4, wherein the position lock is configured such that, when the cam rotates about the cam rotation axis in the reverse direction, the inner rail can linearly translate relative to the rack in a rearward direction opposite the frontward direction.

6. The position lock of claim 5, further comprising a kick component coupled with the locking mechanism, wherein the locking mechanism is operable to, when transitioning to the unlocked configuration, cause the kick component to rotate the cam about the cam rotation axis in the reverse direction.

7. The position lock of claim 4, wherein the locking mechanism includes a ratchet mechanism.

8. The position lock of claim 7, wherein:
the locking mechanism includes a lock handle forming a pawl;
the cam forms a plurality of teeth; and
when the cam rotates about the cam rotation axis, the pawl is configured to sequentially engage with the plurality of teeth.

9. The position lock of claim 8, wherein the locking mechanism includes a spring configured to bias the pawl against the plurality of teeth.

10. The position lock of claim 8, wherein the lock handle is configured to transition from the locked configuration to the unlocked configuration responsive to an unlock force being applied to an unlock portion of the lock handle.

11. The position lock of claim 10, wherein the lock handle is configured such that the pawl disengages from the plurality of teeth responsive to the unlock force being applied.

12. The position lock of claim 11, further comprising a kick component coupled with the lock handle,
wherein: the cam includes a second set of teeth;
the kick component includes a kick pawl that is operable to push against the second set of teeth to rotate the cam about the cam rotation axis in the reverse direction; and
the locking mechanism is operable to, when transitioning to the unlocked configuration, cause the kick component to rotate the cam about the cam rotation axis in the reverse direction.

13. A rack assembly comprising:
a rack;
an inner rail slidably coupled with the rack; and
a position lock including:
a cam rotatably coupled with the rack, the cam operable to:
abut against the inner rail; and
when rotated about a cam rotation axis in a push direction, push the inner rail relative to the rack in a frontward direction that is perpendicular to the cam rotation axis.

14. The rack assembly of claim 13, wherein the cam is operable to, when rotated in the push direction about the cam rotation axis, cause the inner rail to translate a linear distance between 5 millimeters and 15 millimeters.

15. The rack assembly of claim 13, wherein:
the position lock further includes a locking mechanism; and
the locking mechanism is operable to, while in a locked configuration, maintain a rotational position of the cam about the cam rotation axis to prevent the cam from rotating in a reverse direction about the cam rotation axis that is opposite the push direction.

16. The rack assembly of claim 15, wherein the locking mechanism is operable to, while in an unlocked configuration, allow the cam to rotate about the cam rotation axis in the reverse direction.

17. The rack assembly of claim 16, wherein the position lock is configured such that, when the cam rotates about the cam rotation axis in the reverse direction, the inner rail can linearly translate relative to the rack in a rearward direction opposite the frontward direction.

18. The rack assembly of claim 15, wherein the locking mechanism includes a ratchet mechanism.

19. The rack assembly of claim 18, wherein:
the locking mechanism includes a lock handle forming a pawl;
the cam forms a plurality of teeth; and
when the cam rotates about the cam rotation axis, the pawl is configured to sequentially engage with the plurality of teeth.

20. The rack assembly of claim 19, wherein:
the position lock further includes a kick component coupled with the lock handle;
the cam includes a second set of teeth;
the kick component includes a kick pawl that is operable to push against the second set of teeth to rotate the cam about the cam rotation axis in the reverse direction; and
the locking mechanism is operable to, when transitioning to the unlocked configuration, cause the kick component to rotate the cam about the cam rotation axis in the reverse direction.

* * * * *